United States Patent
Ema (10) Patent No.: US 6,442,183 B1
(45) Date of Patent: Aug. 27, 2002

(54) SEMICONDUCTOR LASER DRIVE CONTROL CIRCUIT AND IMAGE FORMING SYSTEM USING THE SAME

(75) Inventor: Hidetoshi Ema, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/559,409

(22) Filed: Apr. 25, 2000

(30) Foreign Application Priority Data

Apr. 26, 1999 (JP) .......................................... 11-117522
Mar. 10, 2000 (JP) ....................................... 2000-065880

(51) Int. Cl.$^7$ ................................................. H01S 3/10
(52) U.S. Cl. ................................................. 372/38.02
(58) Field of Search ..................................... 372/38.02

(56) References Cited

U.S. PATENT DOCUMENTS

| | | | |
|---|---|---|---|
| 5,050,177 A | 9/1991 | Ema ............................. | 372/38 |
| 5,138,623 A | 8/1992 | Ema et al. .................... | 372/38 |
| 5,784,091 A | 7/1998 | Ema et al. ................... | 347/131 |
| 5,946,334 A | 8/1999 | Ema et al. ................. | 372/38.1 |
| 6,259,714 B1 * | 7/2001 | Kinbara .................... | 372/38.02 |
| 6,282,216 B1 * | 8/2001 | Ikeuchi et al. ........ | 372/29.015 |

FOREIGN PATENT DOCUMENTS

| | | |
|---|---|---|
| JP | 5-75199 | 3/1993 |
| JP | 5-235446 | 9/1993 |
| JP | 9-321376 | 12/1997 |

* cited by examiner

Primary Examiner—James W. Davie
(74) Attorney, Agent, or Firm—Oblon, Spivak, McCelland, Maier & Neustadt, P.C.

(57) ABSTRACT

A semiconductor laser drive control circuit includes a first hold/output unit which holds a maximum emission voltage of a semiconductor laser, and supplies the emission voltage, held by the first hold/output unit, to the semiconductor laser when an emission command signal is set. A second hold/output unit sets a bias current in the semiconductor laser, and supplies a bias voltage, held by the second hold/output unit, to the semiconductor laser when the emission command signal is reset. Also disclosed is an image forming system including N semiconductor lasers where N is an integer larger than or equal to 2, and a semiconductor laser drive control circuit which controls a laser beam emission of each of the N semiconductor lasers.

12 Claims, 10 Drawing Sheets

MODE = 0 (QUADRUPLE-SPEED MODE)

| D3 | D2 | D1 | D0 | AP1 | AP2 | OUTPUT PULSES |
|----|----|----|----|-----|-----|---------------|
| 0  | 0  | 0  | 0  | A0  | /A0 |               |
| 0  | 0  | 0  | 1  | A0  | A2  |               |
| 0  | 0  | 1  | 0  | A0  | /A2 |               |
| 0  | 0  | 1  | 1  | A0  | A0  |               |
| 0  | 1  | 0  | 0  | /A2 | /A0 |               |
| 0  | 1  | 0  | 1  | /A2 | A2  |               |
| 0  | 1  | 1  | 0  | /A2 | /A2 |               |
| 0  | 1  | 1  | 1  | /A2 | A0  |               |
| 1  | 0  | 0  | 0  | A2  | /A0 |               |
| 1  | 0  | 0  | 1  | A2  | A2  |               |
| 1  | 0  | 1  | 0  | A2  | /A2 |               |
| 1  | 0  | 1  | 1  | A2  | A0  |               |
| 1  | 1  | 0  | 0  | /A0 | /A0 |               |
| 1  | 1  | 0  | 1  | /A0 | A2  |               |
| 1  | 1  | 1  | 0  | /A0 | /A2 |               |
| 1  | 1  | 1  | 1  | /A0 | A0  |               |

FIG. 8

MODE = 1 (8 GRAYLEVEL MODE)

| D3 | D2 | D1 | D0 | AP1 | AP2 | OUTPUT PULSES |
|----|----|----|----|-----|-----|---------------|
| 0  | 0  | 0  | 0  | A0  | /A0 |               |
| 0  | 0  | 0  | 1  | A1  | /A0 | ▪             |
| 0  | 0  | 1  | 0  | A2  | /A0 | ▬             |
| 0  | 0  | 1  | 1  | A3  | /A0 | ▬▬            |
| 0  | 1  | 0  | 0  | /A0 | /A0 | ▬▬▬           |
| 0  | 1  | 0  | 1  | /A0 | /A1 | ▬▬▬▬          |
| 0  | 1  | 1  | 0  | /A0 | /A2 | ▬▬▬▬▬         |
| 0  | 1  | 1  | 1  | /A0 | /A3 | ▬▬▬▬▬▬        |
| 1  | 0  | 0  | 0  | A0  | A3  |             ▪ |
| 1  | 0  | 0  | 1  | A0  | A2  |            ▬▬ |
| 1  | 0  | 1  | 0  | A0  | A1  |           ▬▬▬ |
| 1  | 0  | 1  | 1  | A0  | A0  |          ▬▬▬▬ |
| 1  | 1  | 0  | 0  | /A3 | A0  |         ▬▬▬▬▬ |
| 1  | 1  | 0  | 1  | /A2 | A0  |        ▬▬▬▬▬▬ |
| 1  | 1  | 1  | 0  | /A1 | A0  |       ▬▬▬▬▬▬▬ |
| 1  | 1  | 1  | 1  | /A0 | A0  |      ▬▬▬▬▬▬▬▬ |

SEMICONDUCTOR LASER DRIVE CONTROL CIRCUIT AND IMAGE FORMING SYSTEM USING THE SAME

BACKGROUND OF THE INVENTION

1. Field of the Invention

The present invention relates to a semiconductor laser drive control circuit for an image forming system using the electrophotographic process, such as a laser printer or a digital copier. Further, the present invention relates to an image forming system which incorporates the semiconductor laser drive control circuit to control the laser beam emission of semiconductor lasers.

2. Description of the Related Art

Figure 12:
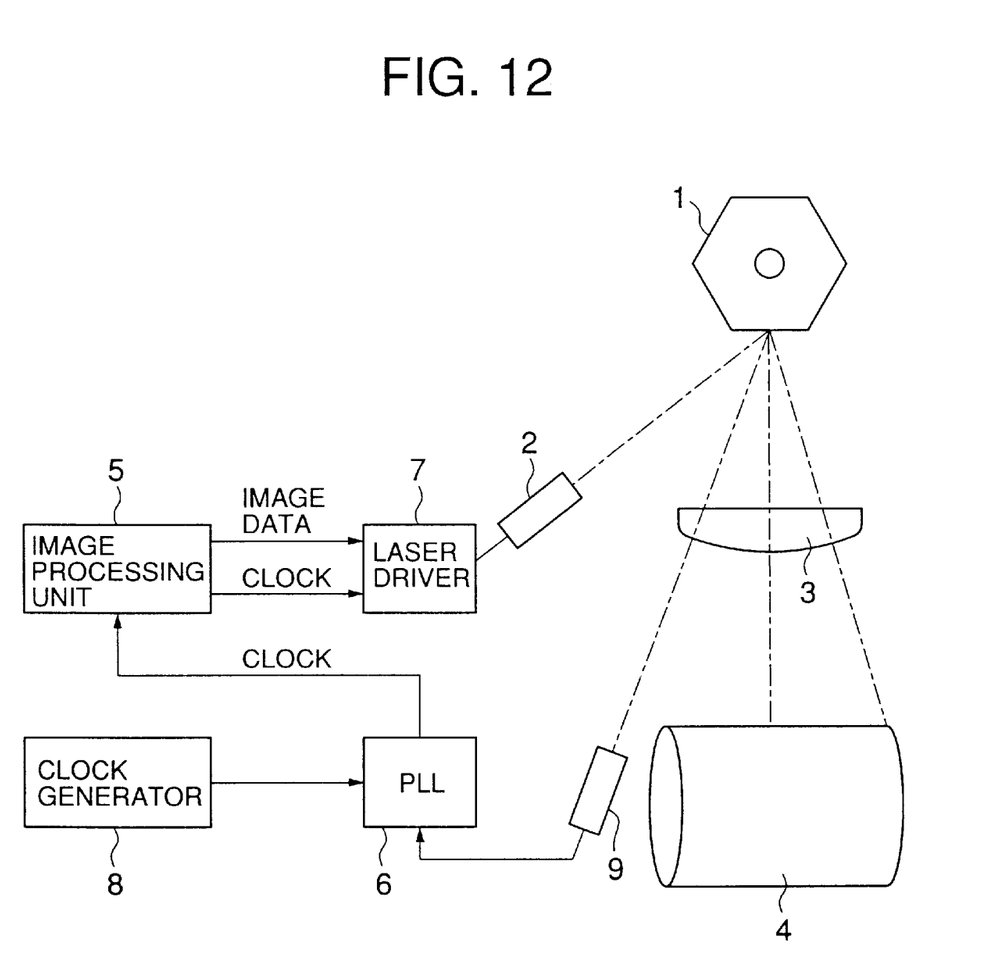
FIG. 12 is a diagram showing an essential portion of an image forming system which uses an electrophotographic process.

FIG. 12 shows an essential part of an image forming system that uses an electrophotographic process in order to form an image on a photosensitive medium by using a laser beam emitted by a semiconductor laser.

In the image forming system of FIG. 12, a polygonal mirror 1 is rotated and a semiconductor laser unit 2 emits a laser beam to one of reflection surfaces of the rotating polygonal mirror 1. The semiconductor laser unit 2 is driven by a laser driver 7 in accordance with image data supplied to the laser driver 7.

In the image forming system of FIG. 12, the laser beam from the semiconductor laser unit 2 is deflected by one of the reflection surfaces of the rotating polygonal mirror 1. The deflected laser beam is passed through an fθ lens 3, and the converging laser beam from the fθ lens 3 hits the surface of a photosensitive medium 4.

As the polygonal mirror 1 is rotated around its rotation axis, the photosensitive medium 3 is scanned by the laser beam along the main scanning line. As the photosensitive medium 3 is rotated around its rotation axis, the photosensitive medium 3 is scanned by the laser beam along the sub-scanning line so that an electrostatic latent image is formed on the photosensitive medium 4 by using the laser beam emitted by the semiconductor laser unit 2. At the same time, a monitoring photodetector 9 receives the laser beam deflected by the polygonal mirror 1 and outputs a detection signal to a phase-locked loop (PLL) 6. A clock generator 8 outputs a clock signal to the PLL 6. The PLL 6 produces a line-sync clock signal, the phase of which is synchronized to the phase of the detection signal supplied by the monitoring photodetector 9, and the line-sync clock signal is sent back to an image processing unit 5, which serves as the source of the image data to form an image on the photosensitive medium 4.

The image forming system of FIG. 12 controls a time of the laser beam emission of the semiconductor laser 2 by using the laser driver 7, and the photosensitive medium 4 is exposed to the laser beam emitted at a controlled timing synchronized with the line-sync clock signal output by the phase-locked loop (PLL) 6. The image processing unit 5 supplies a clock signal synchronized with the line-sync clock signal from the PLL 6, to the laser driver 7, while supplying the data signal to the laser driver 7 in parallel to the clock signal. In this manner, the image forming system of FIG. 12 forms an electrostatic latent image on the photosensitive medium by using the laser beam.

As disclosed in Japanese Laid-Open Patent Applications No. 5-075199, No. 5-235446 and No. 9-321376, a semiconductor laser drive control circuit which controls the time of the laser beam emission of a semiconductor laser is known.

In the conventional semiconductor laser drive control circuit of the type disclosed in the above-mentioned publications, an optical-electrical load feedback loop is provided to amplify a differential current between an emission command signal and a detection signal by using a differential amplifier. The optical-electrical load feedback loop controls the forward current of the semiconductor laser. An automatic setting circuit is provided to set a conversion rate of the conversion of the emission command signal into a drive current of the semiconductor laser. A drive circuit drives the semiconductor laser so as to attain an optical level corresponding to the emission command signal independently of the optical-electrical load feedback loop. A controlled variable of the optical-electrical load feedback loop is decreased to improve high-speed modulation characteristics.

However, in order to attain the positional or dimensional accuracy of the electrostatic latent image formed on the photosensitive medium, it is absolutely necessary for the above-mentioned semiconductor laser drive control circuit to supply the clock signal to various elements of the above-mentioned control circuit, such as the image processing circuit 5 and the laser driver 7, as shown in FIG. 12. The above-mentioned control circuit requires various signal transmission lines provided therein, in order to supply the clock signal to the related circuit elements. Hence, the problem of electromagnetic interference (EMI) in the above-mentioned control circuit will arise. At the same time, the cost of the above-mentioned control circuit will be raised because of the various signal transmission lines and the related circuit elements.

Further, with a recent demand for high-speed, high-density image formation in image forming systems, an improved image forming system, which is provided with two or more semiconductor lasers as the laser light source, has been proposed. There are two schemes of the improved image forming system. One scheme is the use of a semiconductor laser array containing two or more semiconductor lasers for the improved image forming system. The other is the use of two or more separate semiconductor lasers for the improved image forming system.

In the laser-array type image forming system, the monitoring photodetector is shared by the individual semiconductor lasers contained in the semiconductor laser array, and the conventional semiconductor laser drive control method of the above-mentioned publications cannot suitably be applied to the laser-array type with low cost. If additional circuit elements and additional signal transmission lines are used to incorporate the conventional semiconductor laser drive control method into the laser-array type, the cost will be unnecessarily increased.

Accordingly, the latter scheme in which two or more separate semiconductor lasers are used for the improved image forming system has an advantage over the former scheme.

It is conceivable that the conventional semiconductor laser drive control method of the above-mentioned publications be applied to the separate-laser type image forming system. However, in the separate-laser type image forming system, when the optical level output by each semiconductor laser received at the monitoring photodetector is low, the linearity of the conversion of the optical level into the electrical drive current by the feedback loop will be significantly degraded. In some case in which the monitored optical level is low, the drive current of the semiconductor laser becomes too high, which causes a defect in the background part of the image reproduced by the image forming system.

Further, in the separate-laser type image forming system, the optical-electrical load feedback loop always controls the drive current of each semiconductor laser. It is difficult to reset the drive current of the semiconductor laser to zero, so as to completely turn off the semiconductor laser. If an additional control element which forcefully resets the drive current of the semiconductor laser to zero is provided in the image forming system, the cost will be increased further.

SUMMARY OF THE INVENTION

In order to overcome the problems described above, preferred embodiments of the present invention provide an improved semiconductor laser drive control circuit that provides a simple, inexpensive configuration and carries out accurate control of the laser beam emission of each of a plurality of semiconductor lasers provided in an image forming system to attain a high-speed, high-density image formation.

Another object of the present invention is to provide a laser drive controller that provides a simple, inexpensive configuration and carries out accurate control of the laser beam emission of a semiconductor laser of an image forming system to attain a high-speed, high-density image formation.

Another object of the present invention is to provide an improved image forming system that incorporates the semiconductor laser drive control circuit, together with the plurality of semiconductor lasers, the image forming system providing a simple, inexpensive configuration and carrying out accurate control of the time of the laser beam emission of the plurality of semiconductor lasers.

According to one preferred embodiment of the present invention, a laser drive controller includes a first hold/output unit which holds a maximum emission voltage of a semiconductor laser and supplies the emission voltage, held by the first hold/output unit, to the semiconductor laser when an emission command signal is set; and a second hold/output unit which sets a bias current in the semiconductor laser and supplies a bias voltage, held by the second hold/output unit, to the semiconductor laser when the emission command signal is reset.

According to another preferred embodiment of the present invention, a semiconductor laser drive control circuit for an image forming system including N semiconductor lasers provided therein, where N is an integer larger than or equal to 2, includes: a PLL circuit which includes a voltage-controlled oscillator, a programmable counter and a phase detector, the phase detector detecting an error between a phase of a load signal output by the programmable counter and a phase of a reference-frequency signal and outputting a phase-error signal indicative of the detected error, the programmable counter determining a frequency of an output clock signal of the oscillator that is equal to a frequency of an input clock signal of the oscillator divided by a division factor; N pixel clock output units each of which produces a corresponding pixel clock signal for one of the N semiconductor lasers from the output clock signal of the oscillator; and N laser drive controllers each of which produces a corresponding drive signal for one of the N semiconductor lasers from the pixel clock signal produced by a corresponding one of the N pixel clock output units, the drive signal being used to control a laser beam emission of the one of the N semiconductor lasers, each laser drive controller including: a first hold/output unit which holds a maximum emission voltage of one of the N semiconductor lasers, and supplies the emission voltage, held by the first hold/output unit, to the one of the N semiconductor lasers when an emission command signal is set; and a second hold/output unit which sets a bias current in said one of the N semiconductor lasers, and supplies a bias voltage, held by the second hold/output unit, to the one of the N semiconductor lasers when the emission command signal is reset.

According to another preferred embodiment of the present invention, an image forming system includes N semiconductor lasers where N is an integer larger than or equal to 2, and a semiconductor laser drive control circuit which controls a laser beam emission of each of the N semiconductor lasers, the semiconductor laser drive control circuit including: a PLL circuit which includes a voltage-controlled oscillator, a programmable counter and a phase detector, the phase detector detecting an error between a phase of a load signal output by the programmable counter and a phase of a reference-frequency signal and outputting a phase-error signal indicative of the detected error, the programmable counter determining a frequency of an output clock signal of the oscillator that is equal to a frequency of an input clock signal of the oscillator divided by a division factor; N pixel clock output units each of which produces a corresponding pixel clock signal for one of the N semiconductor lasers from the output clock signal of the oscillator; and N laser drive controllers each of which produces a corresponding drive signal for one of the N semiconductor lasers from the pixel clock signal produced by a corresponding one of the N pixel clock output units, the drive signal being used to control a laser beam emission of the one of the N semiconductor lasers, each laser drive controller including: a first hold/output unit which holds a maximum emission voltage of one of the N semiconductor lasers, and supplies the emission voltage, held by the first hold/output unit, to the one of the N semiconductor lasers when an emission command signal is set; and a second hold/output unit which sets a bias current in the one of the N semiconductor lasers, and supplies a bias voltage, held by the second hold/output unit, to the one of the N semiconductor lasers when the emission command signal is reset.

The semiconductor laser drive control circuit of the present invention is effective in providing a simple, inexpensive configuration and in carrying out accurate control of the laser beam emission of each of the semiconductor lasers.

The semiconductor laser drive control circuit of the present invention can provide a fine, accurate oscillation frequency of the clock signal at the output of the voltage-controlled oscillator in the PLL circuit by setting the division factor of the programmable counter to an appropriate number. Hence, it is possible for the semiconductor laser drive control circuit to prevent the degradation of the linearity of the optical-to-electrical conversion by the feedback loop, as in the conventional control circuit, when the optical output level of the semiconductor laser is low.

BRIEF DESCRIPTION OF THE DRAWINGS

Other objects, features and advantages of the present invention will be apparent from the following detailed description when read in conjunction with the accompanying drawings in which.

DETAILED DESCRIPTION OF PREFERRED EMBODIMENTS

A description will now be provided of preferred embodiments of the present invention with reference to the accompanying drawings.

Figure 1:
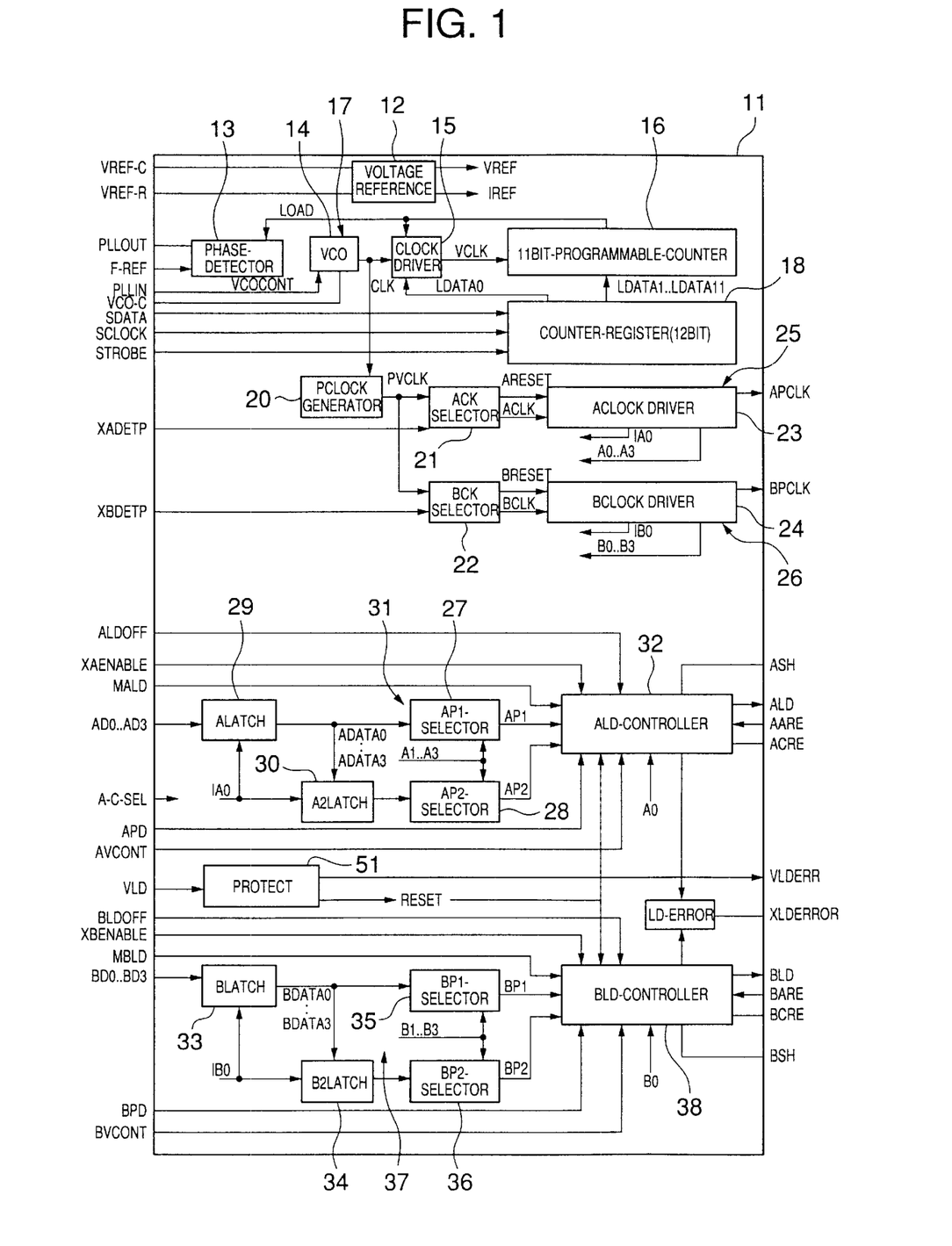
FIG. 1 is a block diagram of one preferred embodiment of a semiconductor laser drive control circuit of the invention.

FIG. 1 is a block diagram of one preferred embodiment of a semiconductor laser drive control circuit of the invention.

Unless otherwise specified, the semiconductor laser drive control circuit of the present embodiment is incorporated into an image forming system, which is configured similar to the image forming system shown in FIG. 12.

In the image forming system of the above type, the laser beam from the semiconductor laser unit 2 is deflected by one of the reflection surfaces of the rotating polygonal mirror 1. The deflected laser beam is pissed through the fθ lens 3, and the converging laser beam from the fθ lens 3 hits the surface of the photosensitive medium 4.

As the polygonal mirror 1 is rotated around its rotation axis, the photosensitive medium 3 is scanned by the deflected laser beam along the main scanning line. Hence, an electrostatic latent image is formed on the photosensitive medium 4 by using the laser beam emitted by the semiconductor laser unit 2. At the same time, the monitoring photodetector 9 receives the deflected laser beam from the polygonal mirror 1 and outputs a detection signal to the phase-locked loop (PLL) 6. The clock generator 8 outputs a clock signal to the PLL 6. The PLL 6 produces a line-sync clock signal, the phase of which is locked to the phase of the detection signal supplied by the monitoring photodetector 9, the line-sync clock signal being sent back to the image processing unit 5, which serves as the source of the image data when forming the image on the photosensitive medium 4.

The image forming system of FIG. 12 controls the time of the laser beam emission of the semiconductor laser 2 by using the laser driver 7, and the photosensitive medium 4 is exposed to the laser beam emitted at a controlled timing synchronized with the line-sync clock signal output by the phase-locked loop (PLL) 6. The image processing unit 5 supplies a clock signal synchronized with the line-sync clock signal from the PLL 6, to the laser driver 7, while supplying the data signal to the laser driver 7 in parallel to the clock signal. In this manner, the image forming system of FIG. 12 forms an electrostatic latent image on the photosensitive medium by using the laser beam.

As shown in FIG. 1, the semiconductor laser drive control circuit of the present embodiment is applied to an image forming system in which two semiconductor lasers are provided as the laser light source to simultaneously emit two separate laser beams in order to scan the photosensitive medium at higher speed and form a higher-density image.

The semiconductor laser drive control circuit of the present embodiment is configured as a single integrated circuit (IC) 11. In the IC 11, a reference-voltage supply unit (RVS) 12 is provided to supply a reference voltage (VREF) to internal elements of the IC 11.

In the IC 11 of the semiconductor laser drive control circuit of the present embodiment, a phase-locked loop (PLL) circuit 17 is provided, and this PLL circuit 17 operates in response to an input reference-frequency signal (F-REF), which is externally supplied to the PLL circuit 17. The PLL circuit 17 in the present embodiment is constituted by a phase detector (PD) 13, a voltage-controlled oscillator (VCO) 14, a clock driver (CD) 15 and an 11-bit programmable counter (PC) 16.

The programmable counter (PC) 16 serves as a frequency divider which determines a frequency of an output clock signal of the VCO 14 that is lower than a frequency of an input clock signal of the VCO 14 and equal to the input clock frequency divided by a division factor.

Further, in the IC 11, a 12-bit counter-register unit (C/R) 18 is connected to the programmable counter 16 of the PLL circuit 17, and the C/R 18 serially transmits eleven most significant bits (MSBs) of load data to the programmable counter 16, and transmits one least significant bit (LSB) of the load data to the clock driver 15. The PC 16 performs the counting of the eleven MSBs "LDATA11" through "LDATA1" of the load data supplied by the C/R 18. When the count value of the PC 16 reaches a preset value (or a division factor), the PC 16 outputs a load signal (LOAD) to the phase detector 13.

The clock driver 15 receives the LSB "LDATA0" of the load data from the C/R 18. When the LSB "LDATA0" of the load data, received at the clock driver 15, is set to 1 at a rising edge of the signal "LOAD" received from the programmable counter 16, the clock driver 15 outputs, to the programmable counter 16, an inverted value of the previous clock signal (VCLK), which was present at the output of the clock driver 15 before the rising edge of the signal "LOAD" from the programmable counter 16 is received.

Figure 2:
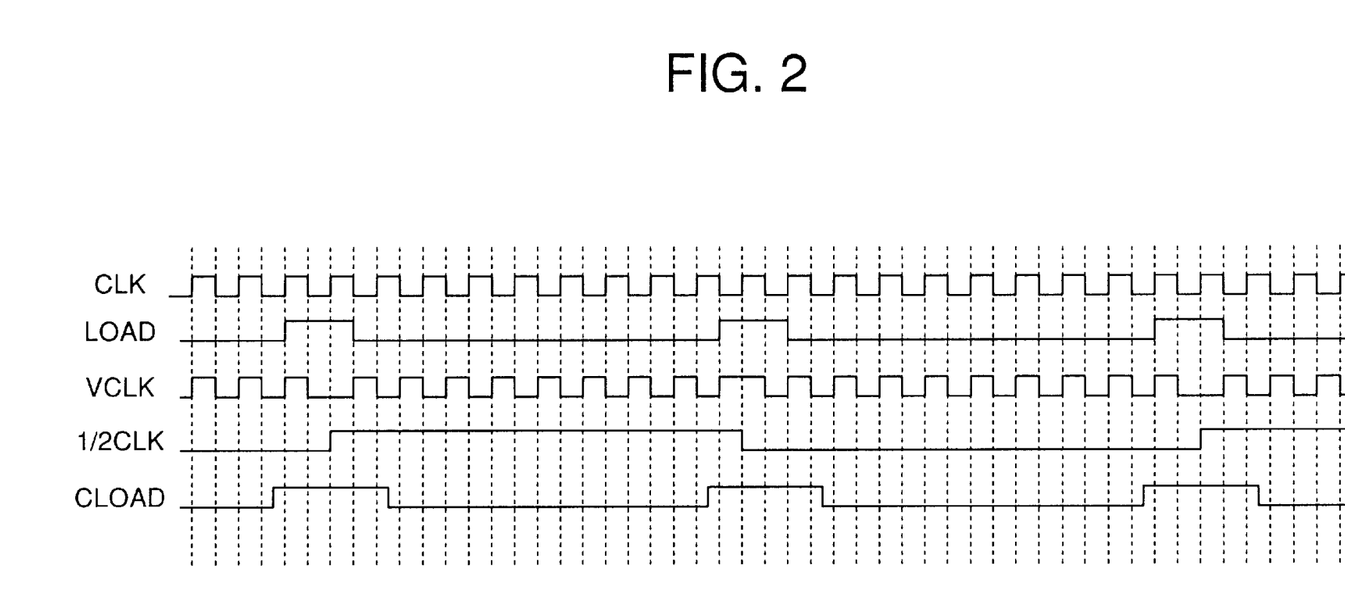
FIG. 2 is a time chart for explaining output signals of the semiconductor laser drive control circuit of FIG. 1.

FIG. 2 is a time chart for explaining output signals of the semiconductor laser drive control circuit of FIG. 1.

In the time chart shown in FIG. 2, the clock signal "CLK" is supplied by the VCO 14 to the clock driver 15. The signal "LOAD" is a pulsed signal output by the 11-bit programmable counter 16 to both the phase detector 13 and the clock driver 15. The clock signal "VCLK" is supplied by the clock driver 15 to the programmable counter 16. The signal "½CLK" is an internal clock signal of the clock driver 15. The signal "CLOAD" is a pulsed signal used to define the time the count value of the programmable circuit 16 is enabled to be loaded. The signal "CLOAD" is supplied by the clock driver 15 to the programmable counter 16 in a manner similar to the clock signal "VCLK".

The internal clock signal "½CLK" is produced by the clock driver 15 to retain the previous state of the signal "VCLK", which was present at the output of the clock driver 15 before the rising edge of the signal "LOAD" from the programmable counter 16 is received.

Referring back to FIG. 1, the phase detector (PD) 13 compares a phase of the rising edge of the signal "LOAD" (received from the programmable counter 16) with a phase of the reference-frequency signal "F-REF". When a phase error between the phase of the reference-frequency signal "F-REF" and the phase of the rising edge of the signal "LOAD" is detected, the phase detector 13 outputs a phase-error signal indicative of the detected phase error to an output terminal "PLLOUT". On the other hand, a control signal "VCOCONT" indicative of an oscillation frequency of the clock signal "CLK" at the output of the voltage-controlled oscillator (VCO) 14 is externally supplied from an input terminal "PLLIN" to the VCO 14 in the PLL circuit 17.

In the semiconductor laser drive control circuit of FIG. 1, a lag/lead filter (not shown) is provided between the input terminal "PLLIN" and the output terminal "PLLOUT". By receiving the phase-error signal from the output terminal "PLLOUT" and supplying the control signal "VCOCONT" produced based on the phase-error signal, to the input terminal "PLLIN" via the lag/lead filter, the PLL circuit 17 controls an oscillation frequency of the clock signal "CLK" at the output of the voltage-controlled oscillator (VCO) 14.

As described above, the PLL circuit 17 is constituted by the phase detector 13, the voltage-controlled oscillator 14, the clock driver 15 and the 11-bit programmable counter (PC) 16.

In the present embodiment, the PLL circuit 17 determines an oscillation frequency "FVCO" of the clock signal CLK at the output of the VCO 14 based on the reference-frequency signal at the input of the VCO 14 (where "F-REF" indicates the reference frequency of the clock signal CLK) and based on the division factor of the programmable counter 16 (where "NF" indicates the division factor of the PC 16 as the frequency divider), as follows:

$$FVCO = F\text{-}REF \times NF \text{ (when } LDATA0=0\text{)}$$

$$FVCO = F\text{-}REF \times (NF+0.5) \text{ (when } LDATA0=1\text{)}$$

In the above formulas, it is assumed that the VCO 14 is provided in a symmetrical differential formation so as to have a duty ratio of 50 percents.

The semiconductor laser drive control circuit of the above-described embodiment can provide a fine, accurate oscillation frequency of the clock signal at the output of the VCO 14 by setting the division factor NF of the programmable counter to an appropriate number. The division factor NF of the programmable counter 16 can be arbitrarily set to either an integer or a decimal fraction. By setting the division factor NF to a decimal number that is smaller than 1, the semiconductor laser drive control circuit of the present embodiment can prevent the degradation of the linearity of the conversion of the optical level into the electrical drive current by the feedback loop, as in the conventional semiconductor laser drive control circuit, when the optical level output by the semiconductor laser received at the monitoring photodetector is low.

Figure 3:
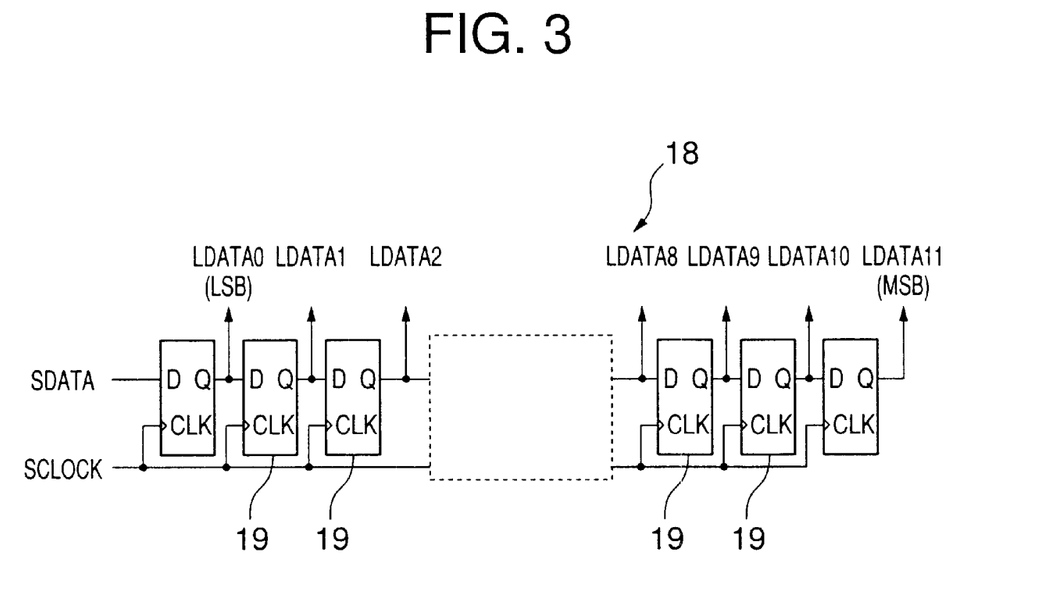
FIG. 3 is a circuit diagram of a counter register unit in the semiconductor laser drive control circuit of FIG. 1.
Figure 4:
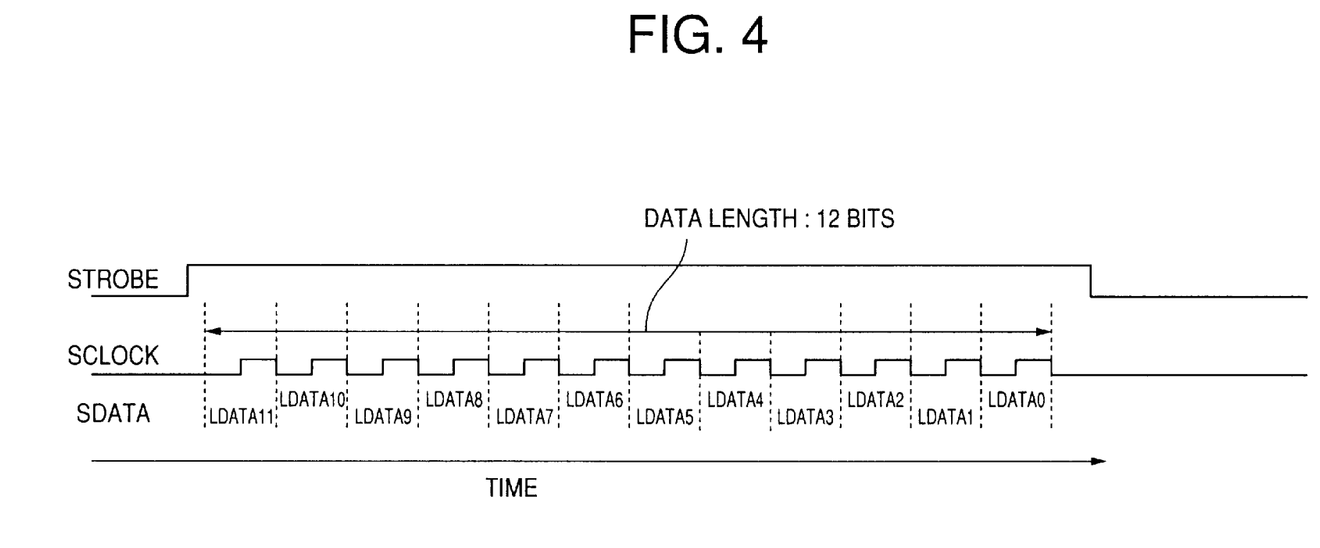
FIG. 4 is a time chart for explaining a waveform of input signals of the counter register unit of FIG. 3.

FIG. 3 is a circuit diagram of the counter-register unit 18 in the semiconductor laser drive control circuit of FIG. 1. FIG. 4 is a time chart for explaining a waveform of input signals of the counter-register unit 18 of FIG. 3.

As shown in FIG. 3, the 12-bit counter register unit (C/R) 18 is constituted by twelve cascaded flip-flops 19. The counter register unit 18 serially transmits the eleven MSBs (LDATA11 to LDATA1) of the load data to the programmable counter (PC) 16, and transmits the LSB (LDATA0) of the load data to the clock driver (CD) 15. The eleven MSBs of the load data are used to set the division factor (NF) in the PC 16. The semiconductor laser drive control circuit of the present embodiment can reduce the number of terminals provided in the IC 11 and is effective in providing a simple, inexpensive configuration.

Referring back to FIG. 1, the semiconductor laser drive control circuit of the present embodiment further comprises a P-clock generator 20, an A-clock selector 21, a B-clock selector 22, an A-clock driver 23, a B-clock driver 24, an AP1 selector 27, an AP2 selector 28, an A-latch 29, an A2-latch 30, an ALD controller 32, a B-latch 33, a B2-latch 34, a BP1 selector 35, a BP2 selector 36, a BLD controller 38, and a power-supply voltage monitoring unit (PROTECT) 51.

In the IC 11 of the semiconductor laser drive control circuit of FIG. 1, the clock signal CLK output by the VCO 14 is sent to the P-clock generator 20. The P-clock generator 20 serves to perform the internal voltage level shift and buffer operations. The P-clock generator 20 produces a clock signal PVCLK from the received clock signal CLK, and this clock signal PVCLK is sent to both the A-clock selector 21 and the B-clock selector 22.

The A-clock selector 21 receives an externally supplied first phase sync signal XADETP as well as the clock signal PVCLK, and produces a reset signal ARESET and a clock signal ACLK which are phase synchronized with the first phase sync signal XADETP. Similarly, the B-clock selector 22 receives an externally supplied second phase sync signal XBDETP as well as the clock signal PVCLK, and produces a reset signal BRESET and a clock signal BCLK which are phase synchronized with the second phase sync signal XBDETP.

The reset signal ARESET and the clock signal ACLK, output by the A-clock selector 21, are sent to the A-clock driver 23. The A-clock driver 23 performs divide-by-4 counter operations on the received clock signal ACLK, and the frequency of an output clock signal APCLK of the A-clock driver 23 is one fourth the frequency of the input clock signal ACLK. The reset signal ARESET is used to reset the divide-by-4 counter operations of the A-clock driver 23. The A-clock driver 23 produces the divide-by-4 clock signal (called the first pixel clock signal APCLK) from the clock signal CLK sent by the VCO 14. Similarly, the B-clock driver 24 produces the divide-by-4 clock signal (called the second pixel clock signal BPCLK) from the clock signal CLK sent by the VCO 14.

In the present embodiment, the inverted state of the clock signal CLK output by the VCO 14 is also used by the A-clock selector 21 or the B-clock selector 22 so as to be synchronized by the first phase sync signal XADETP or the second phase sync signal XBDETP. Hence, the A-clock driver 23 and the B-clock driver 24 respectively produce the first pixel clock signal APCLK and the second pixel clock signal BPCLK which are shifted by about one-eighth the clock cycle of the CLK.

In the semiconductor laser drive control circuit of the present embodiment, the A-clock selector 21 and the A-clock driver 23 form a first pixel clock output unit, and the B-clock selector 22 and the B-clock driver 24 form a second pixel clock output unit.

Figure 5:
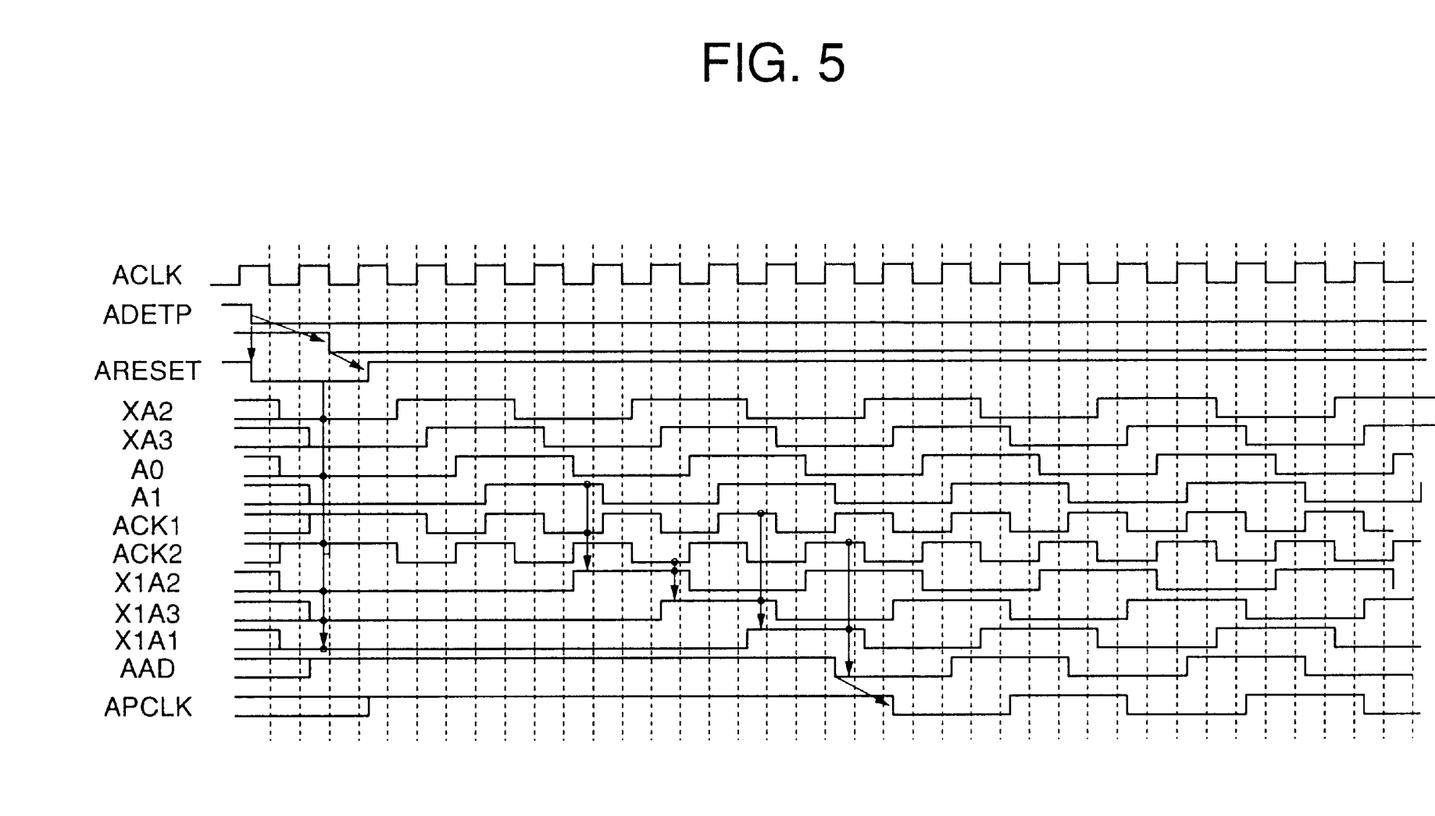
FIG. 5 is a time chart for explaining a waveform of a pixel clock signal in the semiconductor laser drive control circuit of the present embodiment.

FIG. 5 is a time chart for explaining a waveform of a pixel clock signal APCLK in the semiconductor laser drive control circuit of the present embodiment. The waveform of the pixel clock signal APCLK shown in FIG. 5 is for a case in which the non-inverted state of the clock signal CLK is used by the A-clock selector 21. A similar waveform of the pixel clock signal APCLK may be provided for a case in which the inverted state of the clock signal CLK is used by the A-clock selector 21 so as to be synchronized by the first phase sync signal ADETP. The operations of the B-clock selector 22 and the B-clock driver 24 are essentially the same as the operations of the A-clock selector 21 and the A-clock driver 23 except the second phase sync signal XBDETP which is separate from the first phase sync signal XADETP.

In the present embodiment, by providing only the PLL circuit 17 for the two separate semiconductor lasers, it is possible for the first and second pixel clock output units 25 and 25 to produce the two pixel clock signals APCLK and BPCLK that are phase synchronized. Further, it is possible to produce the pixel clock signals APCLK and BPCLK having the frequency that is equal to one fourth the oscillation frequency of the clock signal CLK output by the VCO 14, and these pixel clock signals are shifted by about one-eighth the clock cycle of the CLK.

Further., in the semiconductor laser drive control circuit of FIG. 1, the A-clock driver 23 produces four clock pulses (called the phase-shifted clock pulses A0, A1, A2 and A3) from the clock signal CLK sent by the VCO 14, and the clock pulses A0–A3 are phase shifted from one another by the amount corresponding to ⅛ of the clock cycle of the CLK. Similarly, the B-clock driver 24 produces four clock pulses (called the phase-shifted clock pulses B0, B1, B2 and B3) from the clock signal CLK sent by the VCO 14, and the clock pulses are phase shifted from one another by the amount corresponding to ⅛ of the clock cycle of the CLK. The frequency of these phase-shifted clock pulses A0–A3 and B0–B3 is made to be equal to the frequency of the first phase sync signal XADETP or the second phase sync signal XBDETP.

Figure 6:
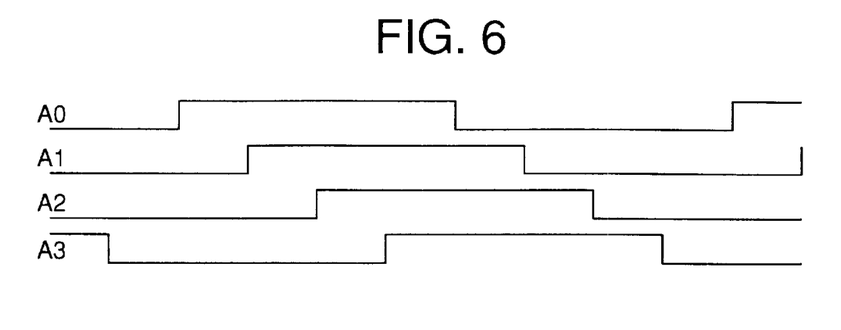
FIG. 6 is a time chart for explaining an operation of a clock driver in the semiconductor laser drive control circuit of the present embodiment.

FIG. 6 is a time chart for explaining an operation of the A-clock driver 23 in the semiconductor laser drive control circuit of the present embodiment. The B-clock driver 24 operates in a similar manner to the A-clock driver 23, and a description thereof will be omitted to avoid duplicate description. A description will now be provided of only the operation of the A-clock driver 23 with reference to FIG. 6.

As shown in FIG. 6, the clock pulses A0–A3 output by the A-clock driver 23 are phase shifted from one another by the amount corresponding to ⅛ of the clock cycle of the CLK. The phase-shifted clock pulses A0–A3 are sent from the A-clock driver 23 to both the AP1 selector 27 and the AP2 selector 28. In this example, the phase of the clock pulse A0 is synchronized with the phase of the first pixel clock signal APCLK.

The A latch 29 receives externally supplied data signals AD0–AD3 and retains the data signals AD0–AD3. The A latch 29 outputs data signals ADATA0–ADATA3 to both the AP1 selector 27 and the A2 latch 30. The A2 latch 30 retains the data signals ADATA0–ADATA3 sent from the A latch 29, and outputs the data signals ADATA0–ADATA3 to the AP2 selector 28 by delaying the output time by half the clock cycle of the CLK.

In the semiconductor laser drive control circuit of the present embodiment, the AP1 selector 27 selects the non-inverted or inverted state of one of the four clock pulses A0–A3 by detecting the data signals ADATA0–ADATA3 in accordance with a mode setting signal, and outputs the selected clock pulse AP1 to the ALD controller 32. Similarly, the AP2 selector 28 selects the non-inverted or inverted state of one of the four clock pulses A0–A3 by detecting the data signals ADATA0–ADATA3 in accordance with the mode setting signal, and outputs the selected clock pulse AP2 to the ALD controller 32.

Figure 7:
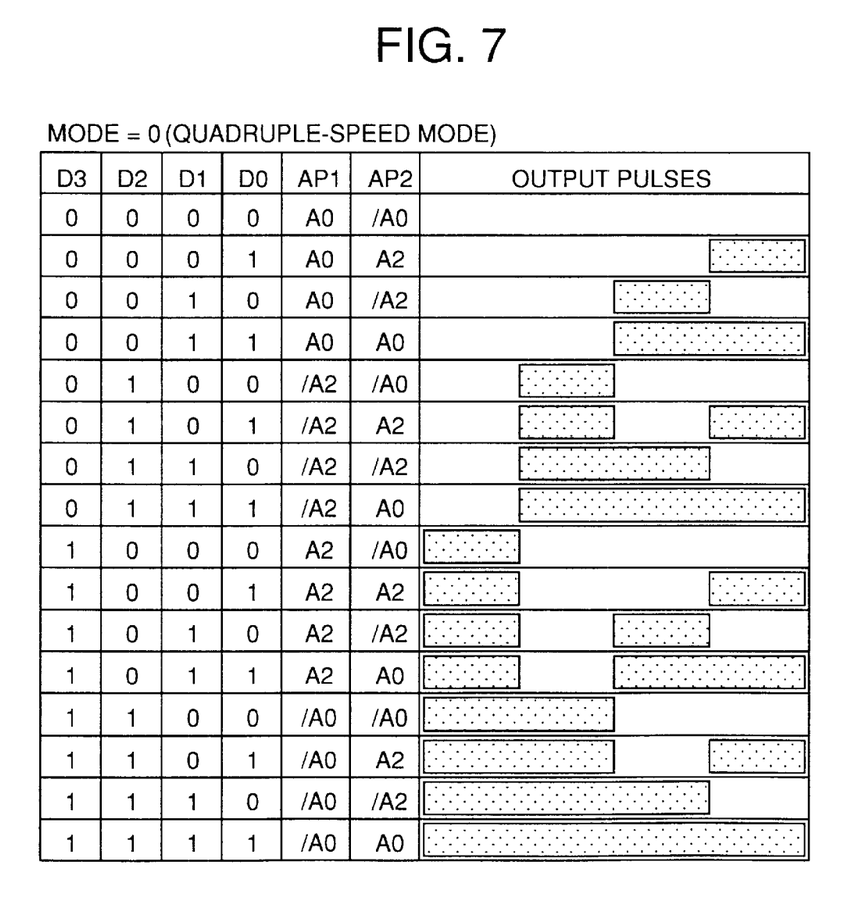
FIG. 7 is a diagram for explaining a format of output pulses of a pulsewidth selector in the semiconductor laser drive control circuit when it is set in quadruple-speed mode.
Figure 8:
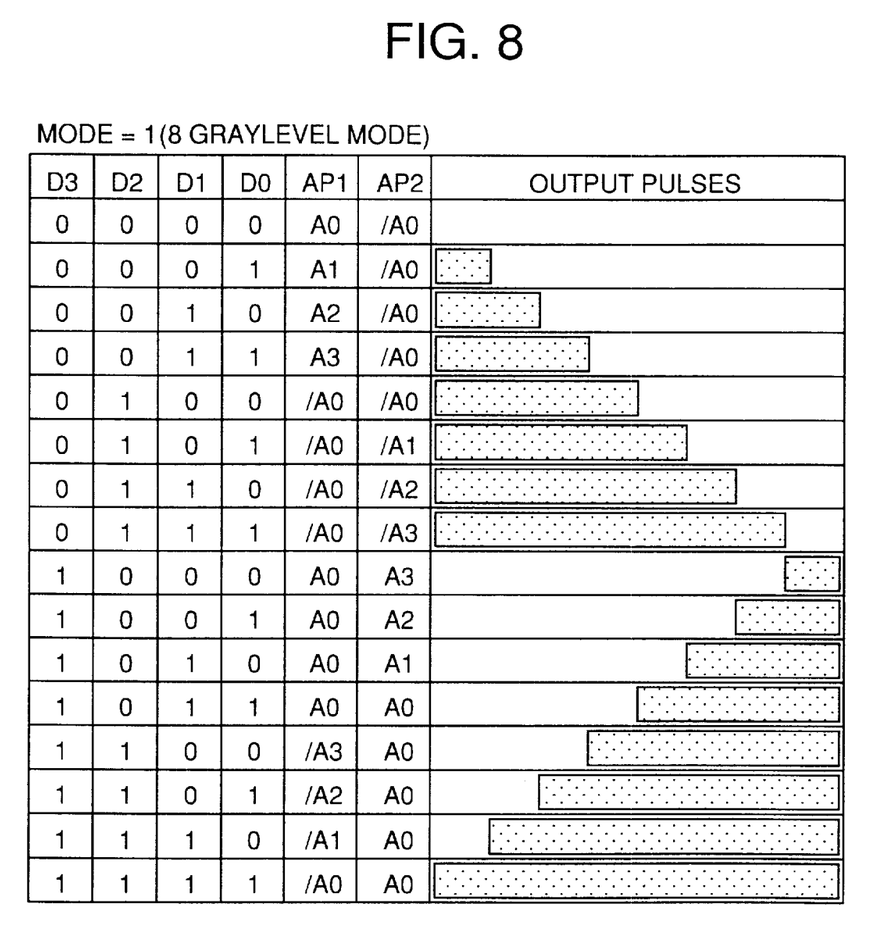
FIG. 8 is a diagram for explaining a format of output pulses of the pulsewidth selector in the semiconductor laser drive control circuit when it is set in eight-graylevel mode.

FIG. 7 is a diagram for explaining a format of output pulses of a pulsewidth selector in the semiconductor laser drive control circuit when it is set in quadruple-speed mode. FIG. 8 is a diagram for explaining a format of output pulses of the pulsewidth selector in the semiconductor laser drive control circuit when it is set in eight-graylevel mode.

In FIG. 7, the format of output pulses for a case in which the mode setting signal is set to the low level (0), or the quadruple-speed mode (MODE=0), is illustrated, and the D0, D1, D2 and D3 indicate the respective values of the bits of the data signals ADATA0–ADATA3, which are considered the modulating signal for each pixel. In FIG. 8, the format of output pulses for a case in which the mode setting signal is set to the high level (1), or the 8 graylevel mode (MODE=1), is illustrated, and the D0, D1, D2 and D3 indicate the respective values of the bits of the data signals ADATA0–ADATA3, which are considered the multilevel modulating signal for each pixel. The output pulses are shown in FIG. 7 and FIG. 8 in a simplified pattern with the high-level signal portions indicated by the shaded areas.

In the semiconductor laser drive control circuit of the present embodiment, the ALD controller 32 receives both the clock pulse AP1 sent by the AP1 selector 27 and the clock pulse AP2 sent by the AP2 selector 28, and produces a pulsewidth modulated drive signal ALD in accordance with a predetermined logical formula which is, for example, $$ALD = AP1 \cdot /A0 + AP2 \cdot A0$$

where "/" denotes the inversion of the clock pulse, "·" denotes the AND logic, and "+" denotes the OR logic.

Figure 9:
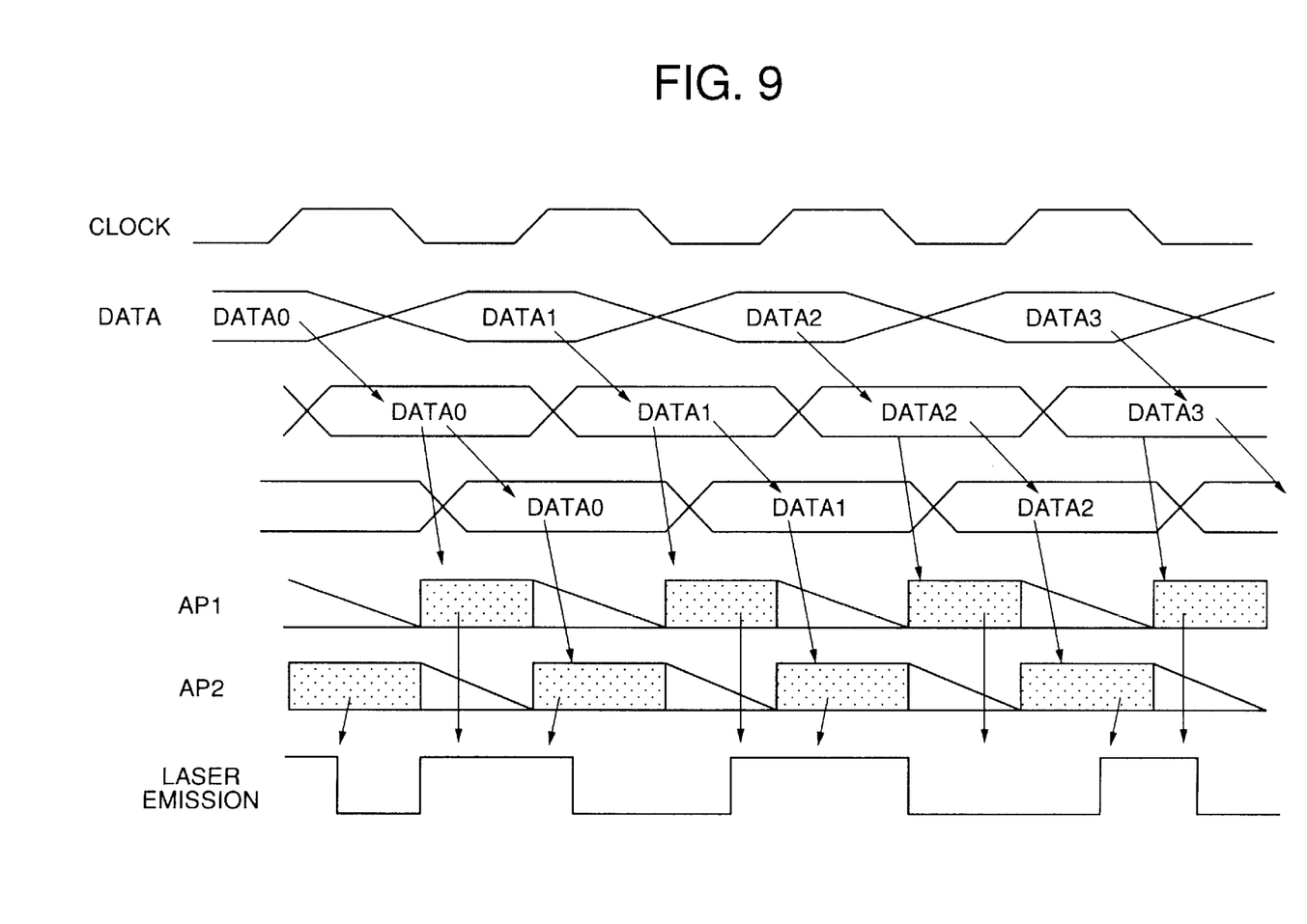
FIG. 9 is a time chart for explaining an operation of the semiconductor laser drive control circuit of the present embodiment.

In the semiconductor laser drive control circuit of the present embodiment, the pulsewidth modulated drive signal ALD output by the ALD controller 32 is used to control the laser beam emission of one of the two semiconductor lasers. FIG. 9 shows this operation of the semiconductor laser drive control circuit of the present embodiment.

In the semiconductor laser drive control circuit of FIG. 1, the A latch 29, the A2 latch 30, the AP1 selector 27 and the AP2 selector 28 forms a first pulsewidth selector 31.

Similarly, the BLD controller 38 receives both the clock pulse BP1 sent by the BP1 selector 35 and the clock pulse BP2 sent by the BP2 selector 36, and produces a pulsewidth modulated data signal BLD in accordance with the predetermined logical formula.

In the semiconductor laser drive control circuit of the present embodiment, the pulsewidth modulated data signal BLD output by the BLD controller 38 is used to drive the other of the two semiconductor lasers. In the semiconductor laser drive control circuit of FIG. 1, the B latch 33, the B2 latch 34, the BP1 selector 35 and the BP2 selector 36 forms a second pulsewidth selector 37.

Figure 10:
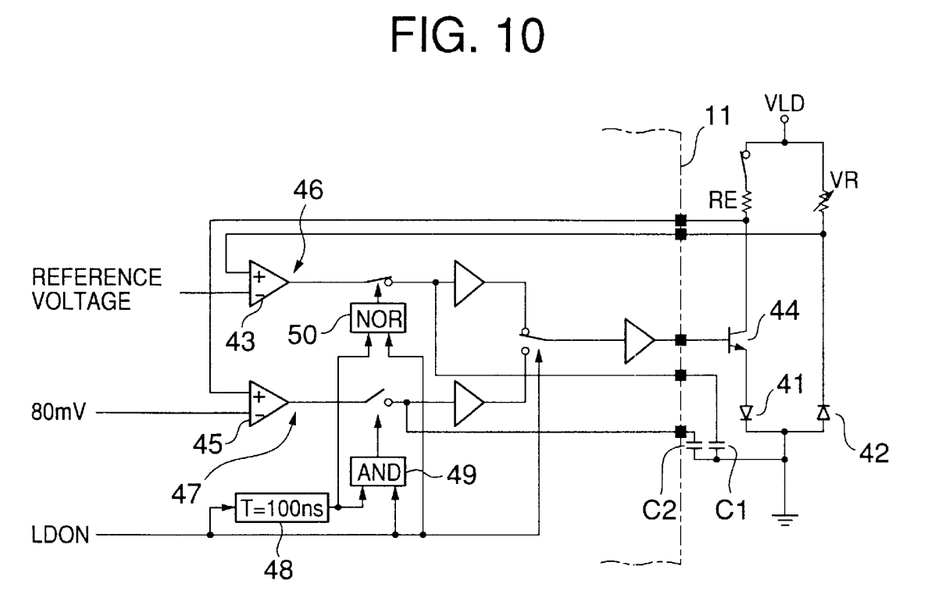
FIG. 10 is a circuit diagram of a laser drive controller in the semiconductor laser drive control circuit of the present embodiment.

FIG. 10 shows a laser drive controller in the semiconductor laser drive control circuit of the present embodiment.

The laser drive controller of FIG. 10 is provided for a cathode-connection circuit configuration to control the time of the laser beam emission of a semiconductor laser 41. The laser drive controller of FIG. 10 is applied to each of the ALD controller 32 and the BLD controller 38 in the semiconductor laser drive control circuit of FIG. 1.

As shown in FIG. 10, in the laser drive controller of the present embodiment, a monitoring photodetector 42 is provided to monitor a laser beam output by the semiconductor laser 41. A variable resistor VR is connected to the monitoring photodetector 42, and the detection signal output by the monitoring photodetector 42 is converted into a corresponding detection voltage at the variable resistor VR. The value of the resistance of the variable resistor VR can be set to an arbitrary resistance value.

The detection voltage from the monitoring photodetector 42 is supplied to the non-inverted input of a first error amplifier 43. A reference voltage is externally supplied to the inverted input of the first error amplifier 43. A transistor 44 is connected to the semiconductor laser 41 according to the cathode-connection circuit configuration. A laser emission command signal LDON is supplied to the transistor 44. When the laser emission command signal LDON to the transistor 44 is set to one (the high level), a first hold capacitor C1 is charged with an emission voltage, and the emission voltage is supplied from the first hold capacitor C1 to the semiconductor laser 41 so that the semiconductor laser 41 emits a laser beam at a controlled level. The emission voltage means a maximum emission voltage of the semiconductor laser 41.

When the laser emission command signal LDON is reset to zero (the low level), the first hold capacitor C1 holds the emission voltage level and does not supply the emission voltage to the semiconductor laser 41. A current detection resistor RE is connected to the semiconductor laser 41 to detect an electrical current in the semiconductor laser 41. A power-supply voltage VLD is supplied through the current detection resistor RE to the semiconductor laser 41. When the laser emission command signal LDON is reset to zero, a voltage between the ends of the current detection resistor RE when the electrical current flows through the semiconductor laser 41 is supplied to the non-inverted input of a second error amplifier 45. A bias-current setting voltage (for example, 80 mV) is supplied to the inverted input of the second error amplifier 45 in order to set a bias current in the semiconductor laser 41. At this time, a second hold capacitor C2 is charged with the bias voltage output by the second error amplifier 45. The bias voltage is supplied from the second hold capacitor C2 to the semiconductor laser 41, and a predetermined bias current flows through the semiconductor laser 41.

In the laser drive controller of FIG. 10, when the laser emission command signal LDON is set to one, the emission voltage is supplied from the first hold capacitor C1 to the semiconductor laser 41, and when the laser emission command signal LDON is reset to zero, the bias voltage is supplied from the second hold capacitor C2 to the semiconductor laser 41. Hence, the laser drive controller of the present embodiment drives the semiconductor laser 41 by the emission voltage to emit the laser beam at the controlled level when the command signal LDON is set to one, and allows the bias current to flow through the semiconductor laser 41 when the command signal LDON is reset to zero.

In the laser drive controller of FIG. 10, the first error amplifier 43 and the first hold capacitor C1 form an emission voltage hold/output unit, and the second error amplifier 45 and the second hold capacitor C2 form a bias voltage hold/output unit.

In the laser drive controller of FIG. 10, a delay circuit 48 having a predetermined delay time T (for example, 100 ns) is provided to receive the laser emission command signal LDON. An AND gate 49 is provided to receive both an output signal of the delay circuit 48 and the laser emission command signal LDON. In the present embodiment, the AND gate 49 forms a second timing generator. A switch is provided between the output of the second error amplifier 45 and the second hold capacitor C2, and this switch is turned on or off in accordance with the output signal of the AND gate 49. When the laser emission command signal LDON is reset to zero, the AND gate 49 serves to delay the time of supplying of the bias voltage from the second error amplifier 45 to the second hold capacitor C2 via the switch by the delay time T. Hence, the laser drive controller of the present embodiment is effective in moderating the circuit requirements to meet the demand for high-speed image formation.

Further, in the laser drive controller of FIG. 10, an NOR gate 50 is provided to receive both the output signal of the delay circuit 48 and the laser emission command signal LDON. In the present embodiment, the NOR gate 50 forms a first timing generator. A switch is provided between the output of the first error amplifier 43 and the first hold capacitor C1, and this switch is turned on or off in accordance with the output signal of the NOR gate 50. When the laser emission command signal LDON is set to one, the NOR gate 50 serves to eliminate the delay of the voltage at the monitoring photodetector 42 and control the supply of the emission voltage from the first error amplifier 43 to the first hold capacitor C1 via the switch without delay.

The laser drive controller of FIG. 10 may be configured such that a capability of external control of the enabling/disabling of the laser emission operations of the semiconductor laser 41 is allocated to the laser emission command signal LDON. Even when only one monitoring photodetector 42 is provided to monitor the laser beam output by the semiconductor laser 41, the operations of the laser drive controller can be controlled by using this capability.

Figure 11:
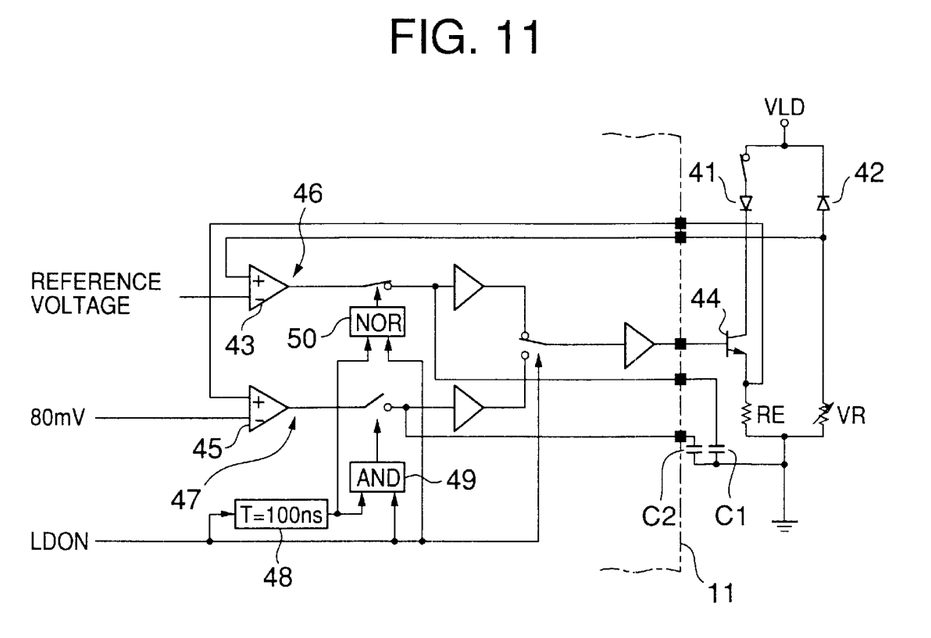
FIG. 11 is a circuit diagram of another laser drive controller in the semiconductor laser drive control circuit of the present embodiment.

FIG. 11 shows another laser drive controller in the semiconductor laser drive control circuit of the present embodiment. In FIG. 11, the elements which are essentially the same as corresponding element in FIG. 10 are designated by the same reference numerals, and a description thereof will be omitted.

The laser drive controller of FIG. 11 is provided for an anode-connection circuit configuration to control the time of the laser beam emission of the semiconductor laser 41. The laser drive controller of FIG. 11 is applied to either the ALD controller 32 or the BLD controller 38 in the semiconductor laser drive control circuit of FIG. 1.

As shown in FIG. 11, in the laser drive controller of the present embodiment, the detection voltage from the monitoring photodetector 42 is supplied to the inverted input of the first error amplifier 43, and the reference voltage is externally supplied to the non-inverted input of the first error amplifier 43. The voltage between the ends of the current detection resistor RE when the electrical current flows through the semiconductor laser 41 is supplied to the inverted input of the second error amplifier 45, and the bias-current setting voltage is supplied to the non-inverted input of the second error amplifier 45.

In the laser drive controller of FIG. 10, the reference voltage and the bias-current setting voltage are measured from the power-supply voltage VLD that is taken as the base potential. In contrast, in the laser drive controller of FIG. 11, the reference voltage and the bias-current setting voltage are measured from the ground level that is taken as the base potential. Other features and advantages of the laser drive controller of the present embodiment are essentially the same as those of the laser drive controller of FIG. 10.

As described above, the semiconductor laser drive control circuit of the above-described embodiment is effective in providing a simple, inexpensive configuration and carrying out accurate control of the time of the laser beam emission of each of the plurality of semiconductor lasers. In addition, one of the cathode-connection circuit configuration shown in FIG. 10 and the anode-connection circuit configuration can be selected so as to suit for the individual applications to the image forming system.

Further, in the IC 11 of FIG. 1, the power-supply voltage monitoring unit (PROTECT) 51 is provided. When the power-supply voltage VLD (supplied to the semiconductor laser 41) is lower than the power-supply voltage Vcc (supplied to the IC 11) by 1.5 volts or more, the power-supply voltage monitoring unit 51 outputs an error detection signal (VLDERR). Further, the power-supply voltage monitoring unit 51 is configured to include a first protection circuit and a second protection circuit. The first protection circuit is provided to set the driving current, sent to the semiconductor laser 41, to zero. The second protection circuit is provided to protect the semiconductor laser 41 against damage when the power-supply voltage of the IC 11 is excessively high and falls outside the permissible voltage range.

When the power-supply voltage monitoring unit 51 is incorporated into the IC 11, it is unnecessary to provide a separate power-supply voltage monitoring unit for the semiconductor laser 41 in an external device.

Further, in the semiconductor laser drive control circuit of FIG. 1, externally supplied signals MALD and MBLD are respectively input to the ALD controller 32 and the BLC controller 38. These signals are supplied to the IC 11 when the semiconductor laser 41 is turned on or off, independently of the pulsewidth modulated data signal that is internally supplied in the IC 11. By using these signals, some modulation scheme of the image data which is different from the pulsewidth modulation scheme may be used.

In the above-described embodiments, the semiconductor laser drive control circuit of the present invention has been applied to an image forming, system in which two semiconductor lasers are provided as the laser light source. The semiconductor laser drive control circuit of the present invention may be applied to an image forming system in which three or more semiconductor lasers are provided as the laser light source. In a case of an image forming system in which "N" semiconductor lasers (where N is an integer larger than or equal to 3) are provided as the laser light source, the semiconductor laser drive control circuit of the present invention is configured to incorporate "N" laser drive controllers that are the same as the laser drive controller shown in FIG. 10 or FIG. 11.

The present invention is not limited to the above-described embodiments, and variations and modifications may be made without departing from the scope of the present invention.

Further, the present invention is based on Japanese priority application No.11-117522, filed on Apr. 26, 1999, and Japanese priority application No.12-065880, filed on Mar. 10, 2000, the entire contents of which are hereby incorporated by reference.

What is claimed is:

1. A light source drive controller for an image forming system having a light source, the light source drive controller comprising:

a first hold/output unit holds a maximum emission voltage of the light source, and supplies the emission voltage to the light source when an emission command signal is set; and a second hold/output unit sets a bias current in the light source, and supplies a bias voltage, held by the second hold/output unit, to the light source when the emission command signal is reset.

2. The light source drive controller according to claim 1, further comprising a first timing generator which controls timing of how long the emission voltage is held by the first hold/output unit based on an NOR logic between the emission command signal and a delayed signal of the emission command signal.

3. The light source drive controller according to claim 1, further comprising a second timing generator which controls timing of how long the bias voltage is held by the second hold/output unit based on an AND logic between the emission command signal and a delayed signal of the emission command signal.

4. The light source drive controller according to claim 1, wherein the light source is a semiconductor laser, and the light source drive controller controls a laser beam emission of the semiconductor laser by selectively supplying one of the emission voltage or the bias voltage to the semiconductor laser.

5. A semiconductor laser drive control circuit for an image forming system including a plurality of semiconductor lasers provided therein, the semiconductor laser drive control circuit comprising:

a PLL circuit including a voltage-controlled oscillator, a programmable counter, and a phase detector, the phase detector detecting an error between a phase of a load signal output by the programmable counter and a phase of a reference-frequency signal to produce a detected error and outputting a phase-error signal indicative of the detected error, the programmable counter determining a frequency of an output clock signal of the oscillator that is equal to a frequency of an input clock signal of the oscillator divided by a division factor;

a plurality of pixel clock output units, wherein each pixel clock output unit of the plurality of pixel clock output unnits produces a pixel clock signal for a corresponding semiconductor laser of the plurality of semiconductor lasers from the output clock signal of the oscillator; and a plurality of laser drive controllers, wherein each laser drive controller of the plurality of laser drive controllers produces a drive signal for a respective semiconductor laser of the plurality of semiconductor lasers from the pixel clock signal produced by each pixel clock output unit of the plurality of pixel clock output units, the drive signal being used to control a laser beam emission of the corresponding semiconductor laser of the plurality of semiconductor lasers, each laser drive controller including:

a first hold/output unit which holds a maximum emission voltage of each semiconductor laser of the plurality of semiconductor lasers, and supplies the emission voltage to an appropriate semiconductor laser of the plurality of semiconductor lasers when an emission command signal is set; and a second hold/output unit which sets a bias current in each semiconductor laser of the plurality of semiconductor lasers, and supplies a bias voltage, held by the second hold/output unit, to a particular semiconductor laser of the plurality of semiconductor lasers when the emission command signal is reset.

6. The semiconductor laser drive control circuit according to claim 5, wherein the PLL circuit, the plurality of pixel clock output units, and the plurality of laser drive controllers are provided in a single integrated circuit.

7. The semiconductor laser drive control circuit according to claim 5, wherein the PLL circuit determines an oscillation frequency FVCO of a clock signal at an output of the voltage-controlled oscillator based on a reference frequency F-REF of the clock signal and a division factor NF of the programmable counter, as follows $$FVCO = F\text{-}REF \times (NF + 0.5).$$

8. The semiconductor laser drive control circuit according to claim 7, wherein the PLL circuit is configured so that the division factor NF of the programmable counter is set to an arbitrary number by using load data bits serially transmitted to the programmable counter.

9. The semiconductor laser drive control circuit according to claim 5, wherein each laser drive controller of the plurality of laser drive controllers is provided with a pulse-width selector, the pulsewidth selector selecting two phase-shifted clock pluses of a plurality of phase-shifted clock pulses and outputting each of the two phase-shifted clock pulses which were selected to an appropriate laser drive controller of the plurality of laser drive controllers.

10. The semiconductor laser drive control circuit according to claim 9, wherein the pulsewidth selector detects respective bits of data signals in accordance with a mode setting signal, so that the appropriate laser drive controller of the plurality of laser drive controllers produces a pulsewidth modulated data signal from each of the two phase-shifted clock pulses which were selected in accordance with a predetermined logical formula, the pulsewidth modulated data signal having a pattern varied by the mode setting signal.

11. The semiconductor laser drive control circuit according to claim 6, further comprising a power-supply voltage monitoring unit which detects whether a power-supply voltage supplied to the plurality of semiconductor lasers is lower than a predetermined level, the power-supply voltage monitoring unit being provided in the single integrated circuit.

12. An image forming system comprising:

a plurality of semiconductor lasers; and a semiconductor laser drive control circuit for controlling a laser beam emission of each of the plurality of semiconductor lasers, the semiconductor laser drive control circuit including:

a PLL circuit including a voltage-controlled oscillator, a programmable counter, and a phase detector, the phase detector detecting an error between a phase of a load signal output by the programmable counter and a phase of a reference-frequency signal to produce a detected error and outputting a phase-error signal indicative of the detected error, the programmable counter determining a frequency of an output clock signal of the oscillator that is equal to a frequency of an input clock signal of the oscillator divided by a division factor;

a plurality of pixel clock output units, wherein each pixel clock output unit of the plurality of pixel clock output units produces a pixel clock signal for a corresponding semiconductor laser of the plurality of semiconductor lasers from the output clock signal of the oscillator; and a plurality of laser drive controllers, wherein each laser drive controller of the plurality of laser drive controllers produces a drive signal for a respective semiconductor laser of the plurality of semiconductor lasers from the pixel clock signal produced by a corresponding pixel clock output unit of the plurality of pixel clock output units, the drive signal being used to control a laser beam emission of the corresponding semiconductor laser of the plurality of semiconductor lasers, each laser drive controller comprising:

a first hold/output unit which holds a maximum emission voltage of each semiconductor laser of the plurality of semiconductor lasers, and which supplies the emission voltage to a particular semiconductor laser of the plurality of semiconductor lasers when an emission command signal is set; and a second hold/output unit which sets a bias current in each semiconductor laser of the plurality of semiconductor lasers, and which supplies a bias voltage, held by the second hold/output unit, to an appropriate semiconductor laser of the plurality of semiconductor lasers when the emission command signal is reset.

\* \* \* \* \*